(12) United States Patent
Kim et al.

(10) Patent No.: US 9,177,865 B2
(45) Date of Patent: Nov. 3, 2015

(54) METHOD FOR FABRICATING SEMICONDUCTOR DEVICE HAVING MULTIPLE THRESHOLD VOLTAGES

(71) Applicant: Samsung Electronics Co., Ltd.

(72) Inventors: Woo-Hee Kim, Hwaseong-si (KR); Nae-In Lee, Seoul (KR); Kug-Hwan Kim, Uiwang-si (KR); Jong-Ho Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/271,909

(22) Filed: May 7, 2014

(65) Prior Publication Data

US 2014/0363960 A1 Dec. 11, 2014

(30) Foreign Application Priority Data

Jun. 5, 2013 (KR) ........................ 10-2013-0064761

(51) Int. Cl.
*H01L 27/11* (2006.01)
*H01L 21/8234* (2006.01)
*H01L 21/8238* (2006.01)
*H01L 21/28* (2006.01)
*H01L 29/49* (2006.01)
*H01L 29/51* (2006.01)

(52) U.S. Cl.
CPC .... *H01L 21/82345* (2013.01); *H01L 21/28088* (2013.01); *H01L 21/28176* (2013.01); *H01L 21/823842* (2013.01); *H01L 29/4966* (2013.01); *H01L 29/517* (2013.01); *H01L 27/1104* (2013.01); *H01L 29/513* (2013.01); *H01L 29/518* (2013.01)

(58) Field of Classification Search
CPC ................. H01L 21/82345; H01L 21/823842; H01L 21/28088; H01L 21/28176; H01L 29/517; H01L 29/4966; H01L 21/823431; H01L 21/823462; H01L 21/823821; H01L 21/823857
USPC ............ 438/585; 257/392, E21.631, E21.632
See application file for complete search history.

(56) References Cited

U.S. PATENT DOCUMENTS

| | | | |
|---|---|---|---|
| 8,105,892 B2 | 1/2012 | Kim et al. | |
| 8,309,447 B2 | 11/2012 | Cheng et al. | |
| 8,324,090 B2 | 12/2012 | Masuoka et al. | |
| 8,354,309 B2 | 1/2013 | Greene et al. | |
| 2007/0122981 A1* | 5/2007 | Park | 438/275 |
| 2010/0320545 A1 | 12/2010 | Jagannathan et al. | |
| 2011/0108921 A1 | 5/2011 | Kanakasabapathy et al. | |
| 2011/0215413 A1 | 9/2011 | Ikeno | |
| 2012/0040522 A1* | 2/2012 | Cheng et al. | 438/585 |
| 2012/0139056 A1 | 6/2012 | Wallner et al. | |
| 2012/0181610 A1 | 7/2012 | Frank et al. | |
| 2012/0184093 A1 | 7/2012 | Chudzik et al. | |
| 2012/0319208 A1 | 12/2012 | Stahrenberg et al. | |
| 2014/0061814 A1* | 3/2014 | Kim et al. | 257/369 |

* cited by examiner

*Primary Examiner* — Mamadou Diallo
*Assistant Examiner* — Christina Sylvia
(74) *Attorney, Agent, or Firm* — Onello & Mello, LLP

(57) ABSTRACT

Provided are methods for fabricating a semiconductor device. A gate dielectric layer is formed on a substrate including first through third regions. A first functional layer is formed on only the first region of the first through third regions. A second functional layer is formed on only the first and second regions of the first through third regions. A threshold voltage adjustment layer is formed on the first through third regions. The threshold voltage adjustment layer includes a work function adjustment material. The work function adjustment material is diffused into the gate dielectric layer by performing a heat treatment process with respect to the substrate.

19 Claims, 14 Drawing Sheets

METHOD FOR FABRICATING SEMICONDUCTOR DEVICE HAVING MULTIPLE THRESHOLD VOLTAGES

CROSS-REFERENCE TO RELATED APPLICATIONS

This application claims priority from Korean Patent Application No. 10-2013-0064761, filed on Jun. 5, 2013 in the Korean Intellectual Property Office, the disclosure of which is incorporated herein in its entirety by reference.

BACKGROUND

1. Field of the Inventive Concept

The present inventive concept relates to a method for fabricating a semiconductor device.

2. Description of the Prior Art

A semiconductor chip may include a combination of transistor types having different threshold voltages. For example, a logic transistor and a RAM transistor, such as an SRAM (Static Random Access Memory) or DRAM (Dynamic Random Access Memory) transistor, may be combined and used on the same semiconductor chip, and may have different threshold voltages.

SUMMARY

One subject to be solved by the present inventive concept is to provide a method for fabricating a semiconductor device having multiple threshold voltages.

Another subject to be solved by the present inventive concept is to provide a semiconductor device having multiple threshold voltages.

Additional advantages, subjects, and features of the inventive concept will be set forth in part in the description which follows and in part will become apparent to those having ordinary skill in the art upon examination of the following or may be learned from practice of the inventive concept.

In one aspect, there is provided a method for fabricating a semiconductor device. A gate dielectric layer is formed on a substrate including first through third regions. A first functional layer is formed on only the first region of the first through third regions. A second functional layer is formed on only the first and second regions of the first through third regions. A threshold voltage adjustment layer is formed on the first through third regions. The threshold voltage adjustment layer includes a work function adjustment material. The work function adjustment material is diffused into the gate dielectric layer by performing a heat treatment process with respect to the substrate.

In some embodiments, an amount of the work function adjustment material, which is diffused into the gate dielectric layer of the first through third regions, differs at each of the first through third regions.

In some embodiments, the amount of the work function adjustment material that is diffused into the gate dielectric layer of the first region is smaller than the amount of the work function adjustment material that is diffused into the gate dielectric layer of the second region, and the amount of the work function adjustment material that is diffused into the gate dielectric layer of the second region is smaller than the amount of the work function adjustment material that is diffused into the gate dielectric layer of the third region.

In some embodiments, the substrate further comprises a fourth region, wherein forming a second functional layer on only the first and second regions includes forming the first functional layer and an etch prevention layer on only the first and fourth regions, and wherein forming the threshold voltage adjustment layer that includes the work function adjustment material on the first through third regions includes forming the threshold voltage adjustment layer that includes the work function material on the first through fourth regions.

In some embodiments, the first functional layer comprises the work function adjustment material.

In some embodiments, the work function adjustment material comprises at least one of lanthanide materials, a nitride thereof, or an alloy thereof.

In some embodiments, the work function adjustment material comprises La.

In some embodiments, the first functional layer, the second functional layer, and the etch prevention layer comprise at least one of Ti, Ta, and Si, a nitride thereof, an alloy thereof, or a stacked structure thereof.

In some embodiments, the first functional layer and the second functional layer each comprises TiN.

In some embodiments, the etch prevention layer comprises TaN.

In some embodiments, forming the gate dielectric layer comprises forming an interface film on the substrate; and forming a gate insulating film having high-k on the interface film.

In some embodiments, the substrate comprises an nFET region and a pFET region, and the method further comprises forming an n-type metal gate on the nFET region and forming a p-type metal gate on the pFET region.

In some embodiments, forming the n-type metal gate on the nFET region and forming the p-type metal gate on the pFET region comprises: forming a p-type work function metal layer on the nFET region and the pFET region of the substrate; removing the p-type work function metal layer from the nFET region of the substrate; and forming the n-type work function metal layer on the nFET region of the substrate.

In some embodiments, the n-type metal gate includes at least one of Al, Ta, Mo, Zr, Hf, V, Ti, a nitride thereof; an alloy thereof, and a stacked structure thereof.

In some embodiments, the p-type metal gate includes at least one of Co, Pd, Ni, Re, Ir, Ru, Ti, a nitride thereof; an alloy thereof; and a stacked structure thereof.

In another aspect of the present inventive concept, there is provided a method for fabricating a semiconductor device. A gate dielectric layer is formed on a substrate including first and second regions. A first threshold voltage adjustment layer is formed on only the first region, the first threshold voltage adjustment layer including a work function adjustment material. An etch prevention layer is formed on the first and second regions. A block layer is formed on only the second region. A second threshold voltage adjustment layer that includes the work function adjustment material is formed on the first and second regions. The work function adjustment material is diffused into the gate dielectric layer by performing a heat treatment process with respect to the substrate.

In some embodiments, an amount of the work function adjustment material diffused into the gate dielectric layer of the first and second regions differs at each of the first and second regions.

In some embodiments, the amount of the work function adjustment material that is diffused into the gate dielectric layer of the second region is smaller than the amount of the work function adjustment material that is diffused into the gate dielectric layer of the first region.

In some embodiments, the block layer comprises at least one of Ti, Ta, and Si, a nitride thereof, an alloy thereof, or a stacked structure thereof.

In another aspect of the present inventive concept, there is provided a method for fabricating a semiconductor device. A gate dielectric layer is formed on a substrate. The gate dielectric layer includes a first region, a second region, and a third region. Each of the first through third regions constructed and arranged for different threshold voltages. A first functional layer is on the first region. A second functional layer is formed on the first and second regions. A threshold voltage adjustment layer is formed on the first through third regions. The threshold voltage adjustment layer includes a work function adjustment material. The work function adjustment material is diffused into the gate dielectric layer. A thickness of the semiconductor device from the threshold voltage adjustment layer to the gate dielectric layer is different at each of the first through third regions.

In some embodiments, the amount of the work function adjustment material diffused into the gate dielectric layer is different at each of the first through third regions, and wherein the threshold voltages at the first through third regions, respectively, are dependent on the amounts of the work function adjustment material diffused into the gate dielectric layer at the first through third regions, respectively.

In some embodiments, the amount of the work function adjustment material that is diffused into the gate dielectric layer of the first region is smaller than the amount of the work function adjustment material that is diffused into the gate dielectric layer of the second region, and the amount of the work function adjustment material that is diffused into the gate dielectric layer of the second region is smaller than the amount of the work function adjustment material that is diffused into the gate dielectric layer of the third region.

In some embodiments, the substrate further comprises a fourth region, wherein forming a second functional layer on only the first and second regions includes forming the first functional layer and an etch prevention layer on only the first and fourth regions, and wherein forming the threshold voltage adjustment layer that includes the work function adjustment material on the first through third regions includes forming the threshold voltage adjustment layer that includes the work function material on the first through fourth regions.

In some embodiments, forming the n-type metal gate on the nFET region and forming the p-type metal gate on the pFET region comprises: forming a p-type work function metal layer on the nFET region and the pFET region of the substrate; removing the p-type work function metal layer from the nFET region of the substrate; and forming the n-type work function metal layer on the nFET region of the substrate.

BRIEF DESCRIPTION OF THE DRAWINGS

The above and other objects, features and advantages of the present inventive concept will be more apparent from the following detailed description taken in conjunction with the accompanying drawings, in which.

DETAILED DESCRIPTION OF THE EMBODIMENTS

Figure 1A:
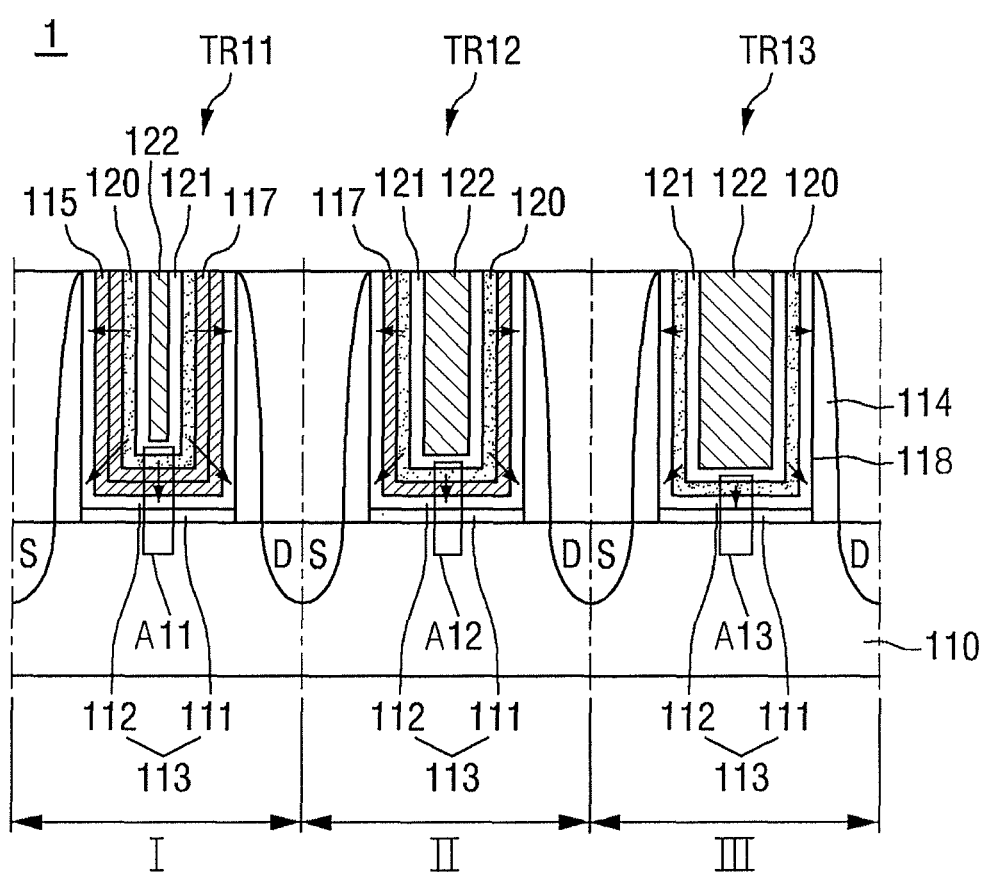
FIG. 1A is a cross-sectional view of a semiconductor device having multiple threshold voltages according to an embodiment.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, preferred embodiments of the present inventive concept will be described.

Figure 1B:
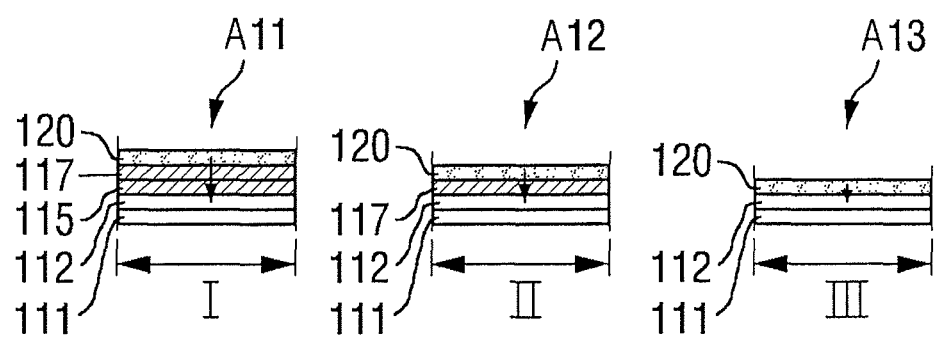
FIG. 1B is a partially enlarged view of regions in FIG. 1A.

FIG. 1A is a cross-sectional view of a semiconductor device 1 having multiple threshold voltages according to an embodiment. FIG. 1B is a partially enlarged view of regions A11, A12, and A13 in FIG. 1A.

Referring to FIG. 1A, a semiconductor device 1 may include first through third transistors TR11, TR12, and TR13, respectively. Each of the transistors TR11, TR12, and TR13 may include a substrate 110, a trench 118, and at least one spacer 114. The substrate 110 may be the same substrate for the first through third transistors TR11, TR12, and TR13. The substrate 110 may be formed of one or more semiconductor materials selected from the group including Si, Ge, SiGe, GaP, GaAs, SiC, SiGeC, InAs, and InP. An SOI (Silicon On Insulator) substrate may be used. Each spacer 114 may be formed on a side wall of the trench 118, and the substrate 110 may arranged on a bottom surface of the trench 118, but is not limited thereto. The spacers 114 of the transistors TR11, TR12, and TR13 may include at least one of a nitride film and an oxynitride film. Further, each spacer 114 may be formed in an "L" shape unlike the illustrated shape. In the drawing, the spacers 114 are illustrated as a single layer, but is not limited thereto. The spacers 114 may be formed as a multilayer. A source S and a drain D may be formed in the substrate 110.

A gate dielectric layer 113 may be formed on the substrate 110. The gate dielectric layer 113 may include an interface film 111 and a gate insulating film 112. The interface film 111 may include a low-k material layer having a dielectric constant that is equal to or lower than 9, for example, a silicon oxide film, where k is about 4, or a silicon oxynitride film, where k is about 4 to 8 depending on the content of oxygen atoms and nitrogen atoms. Further, the interface film 111 may be made of silicate or a combination of the films as exemplified above.

The gate insulating film 112 may be conformally formed along the side wall and the bottom surface of the trench 118 on the interface film 111. The gate insulating film 112 may include a high-k material having a dielectric constant that is higher than the dielectric constant of the silicon oxide film. For example, the gate insulating film 112 may include a material selected from the group including HfSiON, $HfO_2$, $ZrO_2$, $TiO_2$, $SrTiO_3$, and $(Ba, Sr)TiO_3$. The gate insulating film 112 may be formed with a proper thickness according to the kind of devices to be formed.

Referring again to FIG. 1A, a first region I, a second region II, and a third region III, in which the semiconductor device 1 having multiple threshold voltages is formed, may be defined on the substrate 110. The first region I, the second region II, and the third region III may be regions which are connected to each other or, alternatively, which are separated from each other.

At a particular region, a first functional layer 115 and a second functional layer 117 may be selectively formed on the gate insulating film 112 of the gate dielectric layer 113. A threshold voltage adjustment layer 120 may include a work function adjustment material, and may be formed on the first functional layer 115 and the second functional layer 117, which are selectively formed on the gate insulating film 112.

Specifically, referring to FIG. 1B, the first functional layer 115 and the second functional layer 117 may be formed on the first region I, only the second functional layer 117 may be formed at the second region II, and the first functional layer 115 and the second functional layer 117 may not be formed on the third region III. The first functional layer 115 and the second functional layer 117 may serve as block layers which limit the amount of the work function adjustment material that is diffused from the threshold voltage adjustment layer 120 to the gate dielectric layer 113. In particular, by selectively forming the first functional layer 115 and/or the second functional layer 117 to form a block layer between the threshold voltage adjustment layer 120 and the gate dielectric layer 113 having various thicknesses, the amount of the work function adjustment material that is diffused to the gate dielectric layer 113 of the first region I, the second region II, and third region III can vary. The detailed description thereof will be made later.

A protection layer 121 and a gate electrode 122 may be formed on the threshold voltage adjustment layer 120, for example, at the third region III. The protection layer 121 may protect the threshold voltage adjustment layer 120 and lower layers thereof. For example, the protection layer 121 may prevent oxide curing or regrowth that may occur in a subsequent heat treatment process. In some embodiments of the present inventive concept, the protection layer 121 may include TiN. In some embodiments of the present inventive concept, the gate electrode 122 may include polysilicon (poly-Si) or amorphous silicon (a-Si). Further, in some embodiments of the present inventive concept, the electrode 122 may include metal.

Figure 1C:
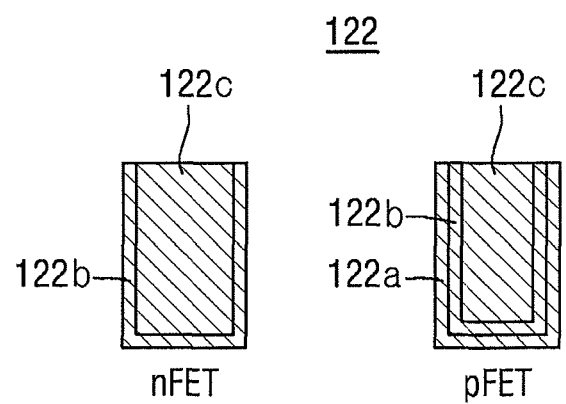
FIG. 1C is a view of the gate electrode illustrated in FIG. 1A.

FIG. 1C is a view of the gate electrode 122 illustrated in FIG. 1A. In some embodiments of the present inventive concept, the gate electrode 122 in an nFET region may include an n-type work function metal layer 122b and a gate metal 122c. The gate electrode 122 in a pFET region may include a p-type work function metal layer 122a, the n-type work function metal layer 122b, and the gate metal 122c.

In some embodiments of the present inventive concept, the first functional layer 115 and the second functional layer 117 may include one or more elements, for example, Ti, Ta, or Si. In other embodiments of the present inventive concept, the first functional layer 115 and the second functional, layer 117 may include, for example, a nitride and an element, for example, TiN. Further, in some other embodiments of the present inventive concept, the first functional layer 115 and the second functional layer 117 may include an alloy comprising one nitride of an element such as Ti, Ta, and Si. Further, in some other embodiments of the present inventive concept, the first functional layer 115 and the second functional layer 117 may include their stacked structure. The first functional layer 115 and the second functional layer 117 as described above may be formed with a proper thickness according to the kind of devices to be formed.

In some embodiments of the present inventive concept, the work function adjustment material included in the threshold voltage adjustment layer 120 may include a lanthanide material, such as La. Further, in some other embodiments of the present inventive concept, the work function adjustment material included in the threshold voltage adjustment layer 120 may include a nitride of a lanthanide material. Further, in some other embodiments of the present inventive concept, the work function adjustment material included in the threshold voltage adjustment layer 120 may include an alloy comprising a nitride of lanthanide materials. The threshold voltage adjustment layer 120 may be formed with a proper thickness according to the kind of devices to be formed.

Hereinafter, a case where the respective regions of the substrate of the semiconductor device 1 have different threshold voltages will be described in more detail. Hereinafter, it is exemplified that the first through third transistors TR11, TR12, and TR13 are nFETs. However, in the case of pFETs, they are the opposite.

For example, the concentration of the work function adjustment material included in the first region I of the gate dielectric layer 113 may be lower than the concentration of the work function adjustment material included in the second region II of the gate dielectric layer 113. The concentration of the work function adjustment material included in the second region II of the gate dielectric layer 113 may be lower than the concentration of the work function adjustment material included in the third region III of the gate dielectric layer 113. In this case, if it is assumed that the threshold voltages of the transistors TR11, TR12, and TR13 formed at respective regions are $Vt_{11}$, $Vt_{12}$, and $Vt_{13}$, respectively, the relationship described in Table 1 below is established.

TABLE 1

| First Region I | Second Region II | Third Region III |
|---|---|---|
| Threshold voltage adjustment layer 120 | | |
| Second functional layer 117 | Threshold voltage adjustment layer 120 | |

TABLE 1-continued

| First Region I | Second Region II | Third Region III |
|---|---|---|
| First functional layer 115 | First functional layer 115 | Threshold voltage adjustment layer 120 |
| Gate dielectric layer 113 | Gate dielectric layer 113 | Gate dielectric layer 113 |
| $Vt_{11}$ | $Vt_{12}$ $Vt_{11} > Vt_{12} > Vt_{13}$ | $Vt_{13}$ |

In embodiments where a heat treatment process is performed, for example, described herein, the work function adjustment material included in the threshold voltage adjustment layer 120 is diffused into the gate dielectric layer 113 through at least one of the first functional layer 115 and the second functional layer 117. In this case, due to a difference in thickness that is caused by the layer formed between the threshold voltage adjustment layer 120 and the gate dielectric layer 113, i.e., at least one of the first functional layer 115 and the second functional layer 117, the amount of the work function adjustment material that is diffused into the gate dielectric layer 113 differs. At the first region I, the thickness between the threshold voltage adjustment layer 120 and the gate dielectric layer 113 is the greatest of the various thicknesses. Thus, the amount of the work function adjustment material that is diffused into the gate dielectric layer 113 at the first region I is the smallest as compared to the other regions. Accordingly, the threshold voltage $Vt_{11}$ of the transistor TR11 formed on the first region I can be the greatest. Since the second region II is the region in which the thickness between the threshold voltage adjustment layer 120 and the gate dielectric layer 113 is the next largest thickness, the threshold voltage $Vt_{12}$ of the transistor TR12 formed on the second region II can be smaller than $Vt_{11}$, and larger than $Vt_{13}$.

Unlike the foregoing embodiment, if the threshold voltage adjustment is performed by a method for discriminating between the concentrations of ion implantation (IIP), the performance of the semiconductor device 1 may be affected by a variation of the threshold voltage due to a dopant change. Further, in the case of a thin-body transistor, it becomes difficult to precisely adjust the threshold voltage through such a doping method. Further, unlike this embodiment, in the case of performing the threshold voltage adjustment through a method for adjusting, for example, the thickness, the doping concentration, or the channel length and width of the gate oxide film, additional mask sets and processes are required which can result in an increase in manufacturing cost and process complexity.

The foregoing embodiment, on the other hand, provides a semiconductor device having multiple threshold voltages that can be provided at a relatively low manufacturing cost and in simple processes, without deteriorating the device performance due to the variation of the threshold voltage or deterioration of the charge mobility.

Figure 2A:
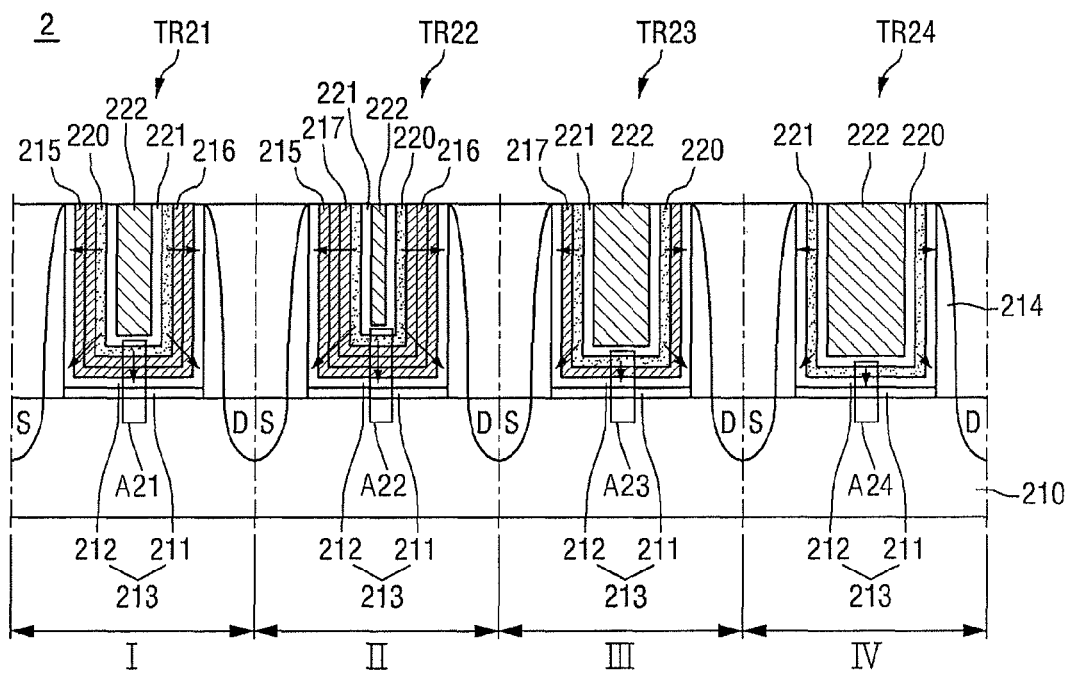
FIG. 2A is a cross-sectional view of a semiconductor device having multiple threshold voltages according to another embodiment.
Figure 2B:
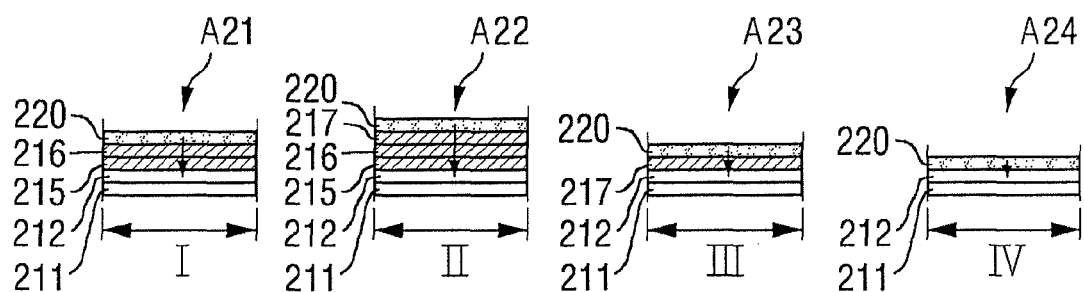
FIG. 2B is a partially enlarged view of regions in FIG. 2A.

FIG. 2A is a cross-sectional view of a semiconductor device 2 having multiple threshold voltages according to another embodiment. FIG. 2B is a partially enlarged view of regions A21, A22, A23, and A24 in FIG. 2A.

A first region I, a second region II, a third region III, and a fourth region IV may be defined on a substrate 210. The semiconductor device 2 can have multiple threshold voltages, where are formed first region I, a second region II, a third region III, and a fourth region IV. The first region I, the second region II, the third region III, and the fourth region IV may be regions which are connected to each other, or which are separated from each other.

A first functional layer 215, an etch prevention layer 216, and a second functional layer 217 may be selectively formed on a gate insulating film 212. A threshold voltage adjustment layer 220 may include a work function adjustment material, and may be formed on the first functional layer 215, the etch prevention layer 216, and the second functional layer 217, which are selectively formed on the gate insulating film 212.

Specifically, referring to FIG. 2B, the first functional layer 215 and the etch prevention layer 216 may be formed at the first region I. The first functional layer 215, the etch prevention layer 216, and the second functional layer 217 may be formed at the second region II. Only the second functional layer 217 may be formed on the third region III. The first functional layer 215, the etch prevention layer 216, and the second functional layer 217 are not formed on the fourth region IV. The first function 215, the etch prevention layer 216, and the second functional layer 217 may serve as block layers which limit the amount of the work function adjustment material that is diffused from the threshold voltage adjustment layer 220 to a gate dielectric layer 213. In particular, by selectively forming the first functional layer 215, the etch prevention layer 216, and the second functional layer 217 to make the block layer between the threshold voltage adjustment layer 220 and the gate dielectric layer 213 have various thicknesses, the amount of the work function adjustment material that is diffused to the gate dielectric layer 213 of the first region I, the second region II, third region III, and/or the fourth region IV can vary. The detailed description thereof will be made later. On the other hand, a protection layer 221 and a gate electrode 222 may be formed at the threshold voltage adjustment layer 220.

In some embodiments of the present inventive concept, the etch prevention layer 216 may include, for example, Ti, Ta, Si, or the like. Further, in some other embodiments of the present inventive concept, the etch prevention layer 216 may include, for example, one nitride of Ti, Ta, and Si, such as TaN. Further, in some other embodiments of the present inventive concept, the etch prevention layer 216 may include an alloy comprising a nitride of Ti, Ta, and Si. In other embodiments of the present inventive concept, the etch prevention layer 216 may include their stacked structure. The etch prevention layer 216 as described above may be formed with a proper thickness according to the kind of devices to be formed.

Hereinafter, a case where the respective regions of the substrate of the semiconductor device 2 have different threshold voltages will be described in more detail. Hereinafter, it is exemplified that the first through fourth transistors TR21, TR22, TR23, and TR24 are nFETs, but in the case of pFETs, they are the opposite.

For example, the concentration of the work function adjustment material included in the second region II of the gate dielectric layer 213 may be lower than the concentration of the work function adjustment material included in the first region I of the gate dielectric layer 213, the concentration of the work function adjustment material included in the first region I of the gate dielectric layer 213 may be lower than the concentration of the work function adjustment material included in the third region III of the gate dielectric layer 213, and the concentration of the work function adjustment material included in the third region III of the gate dielectric layer 213 may be lower than the concentration of the work function adjustment material included in the fourth region IV of the gate dielectric layer 213. In this case, assuming that the threshold voltages of the transistors TR21, TR22, TR23, and TR24 formed on the respective regions are referred to as $Vt_{21}$, $Vt_{22}$, $Vt_{23}$, and $Vt_{24}$, respectively, the relationship described in Table 2 below is established.

TABLE 2

| First Region I | Second Region II | Third Region III | Fourth Region III |
|---|---|---|---|
| Threshold voltage adjustment layer 220 Etch prevention layer 216 First functional layer 215 Gate dielectric layer 213 $Vt_{21}$ | Threshold voltage adjustment layer 220 Second functional layer 217 Etch prevention layer 216 First functional layer 215 Gate dielectric layer 213 $Vt_{22}$ | Threshold voltage adjustment layer 220 Second functional layer 217 Gate dielectric layer 213 $Vt_{23}$ | Threshold voltage adjustment layer 220 Gate dielectric layer 213 $Vt_{24}$ |
| | $Vt_{22} > Vt_{21} > Vt_{23} > Vt_{24}$ | | |

If a heat treatment process to be described later is performed, then the work function adjustment material included in the threshold voltage adjustment layer 220 is diffused into the gate dielectric layer 213 through at least one of the first functional layer 215, the etch prevention layer 216, and the second functional layer 217. In this case, due to a difference in thickness that may be caused by the layer formed between the threshold voltage adjustment layer 220 and the gate dielectric layer 213, i.e., at least one of the first functional layer 215, the etch prevention layer 216, and the second functional layer 217, the amount of the work function adjustment material that is diffused into the gate dielectric layer 213 differs. At second region II, the thickness between the threshold voltage adjustment layer 220 and the gate dielectric layer 213 is the greatest, and thus the amount of the work function adjustment material that is diffused into the gate dielectric layer 213 would may be the smallest. Accordingly, the threshold voltage $Vt_{22}$ of the transistor TR22 formed on the second region II can become the highest. Since the first region I is the region at which the thickness between the threshold voltage adjustment layer 220 and the gate dielectric layer 213 is the next largest thickness, the threshold voltage $Vt_{21}$ of the transistor TR21 formed on the first region I can be smaller than $Vt_{22}$, but larger than $Vt_{23}$.

As described above, according to this embodiment, a semiconductor device having multiple threshold voltages can be provided at a relatively low manufacturing cost and according to simple processes, without deteriorating the device performance due to the variation of the threshold voltage or deterioration of the charge mobility.

Figure 3A:
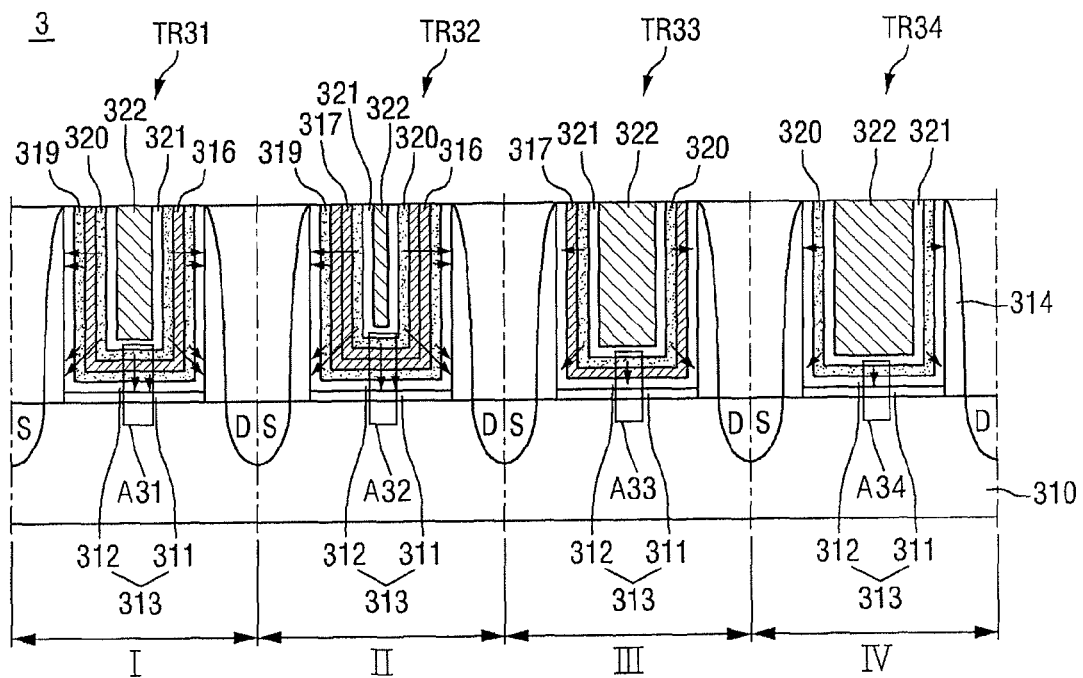
FIG. 3A is a cross-sectional view of a semiconductor device having multiple threshold voltages according to another embodiment.
Figure 3B:
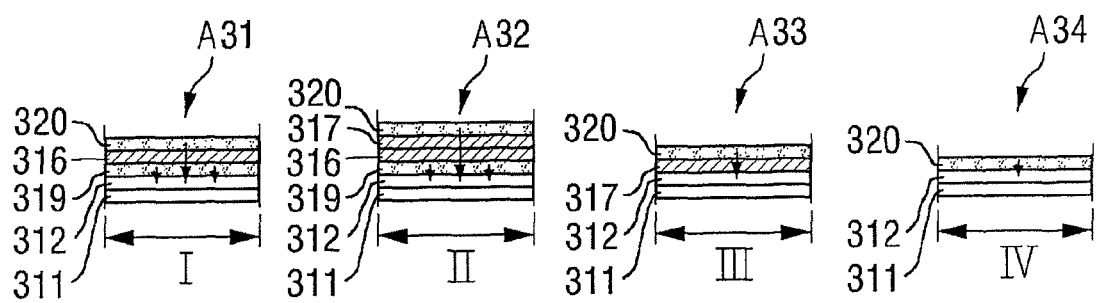
FIG. 3B is a partially enlarged view of regions in FIG. 3A.

FIG. 3A is a cross-sectional view of a semiconductor device 3 having multiple threshold voltages according to another embodiment, and FIG. 3B is a partially enlarged view of regions A31, A32, A33, and A34 in FIG. 3A.

Referring again to FIG. 3A, a first region I, a second region II, a third region III, and a fourth region IV, in which the semiconductor device 3 having multiple threshold voltages is formed, are defined on a substrate 310, for example, similar to an embodiment of FIGS. 2A and 2B.

A threshold voltage adjustment layer 319, an etch prevention layer 316, and a second functional layer 317 may be selectively formed on a gate insulating film 312. The threshold voltage adjustment layer 319 may include a work function adjustment material. A threshold voltage adjustment layer 320 may be formed on a threshold voltage adjustment layer 319, the etch prevention layer 316, and/or the second functional layer 317.

Specifically, referring to FIG. 3B, the threshold voltage adjustment layer 319 and the etch prevention layer 316 may be formed on the first region I, and the threshold voltage adjustment layer 319, the etch prevention layer 316, and the second functional layer 317 may be formed on the second region II. Only the second functional layer 317 may be formed on the third region III. None of the threshold voltage adjustment layer 319, the etch prevention layer 316, and the second functional layer 317 are formed on the fourth region IV. Here, the threshold voltage adjustment layer 319 may diffuse the work function adjustment material into the gate dielectric layer 313 in addition to the diffusion from the threshold voltage adjustment layer 320 to the gate dielectric layer 313. By forming the transistor having the layer structure as described above, the threshold voltage can be greatly lowered through an additional increase of the amount of the work function adjustment material that is diffused into the gate dielectric layer 313 if necessary. Thus, the difference between the multiple threshold voltages can be surely increased. A protection layer 321 and a gate electrode 322 may be formed on the threshold voltage adjustment layer 320.

Hereinafter, a case where the respective regions of the substrate of the semiconductor device 3 have different threshold voltages will be described in more detail. The examples herewith can refer to the first through fourth transistors TR31, TR32, TR33, and TR34 are nFETs. In the case of pFETs, they are the opposite.

For example, the concentration of the work function adjustment material included in the third region III of the gate dielectric layer 313 may be lower than the concentration of the work function adjustment material included in the fourth region IV of the gate dielectric layer 313, the concentration of the work function adjustment material included in the fourth region IV of the gate dielectric layer 313 may be lower than the concentration of the work function adjustment material included in the second region II of the gate dielectric layer 313. The concentration of the work function adjustment material included in the second region II of the gate dielectric layer 313 may be lower than the concentration of the work function adjustment material included in the first region I of the gate dielectric layer 313. In this case, if it is assumed that the threshold voltages of the transistors TR31, TR32, TR33, and TR34 formed on regions I-IV are $Vt_{31}$, $Vt_{32}$, $Vt_{33}$, and $Vt_{34}$, respectively, the relationship described in Table 3 below is established.

TABLE 1

| First Region I | Second Region II | Third Region III | Fourth Region III |
|---|---|---|---|
| | Threshold voltage adjustment layer 320 | | |
| Threshold voltage adjustment layer 320 | Second functional layer 317 | | |
| Etch prevention layer 316 | Etch prevention layer 316 | Threshold voltage adjustment layer 320 | |
| Threshold voltage adjustment layer 319 | Threshold voltage adjustment layer 319 | Second functional layer 317 | Threshold voltage adjustment layer 320 |
| Gate dielectric layer 313 | Gate dielectric layer 313 | Gate dielectric layer 313 | Gate dielectric layer 313 |
| $Vt_{31}$ | $Vt_{32}$ | $Vt_{33}$ | $Vt_{34}$ |
| | $Vt_{33} > Vt_{34} > Vt_{32} > Vt_{31}$ | | |

If a heat treatment process to be described later is performed, then the work function adjustment material included in the threshold voltage adjustment layer 319 is additionally diffused from the threshold voltage adjustment layer 319. Accordingly, the threshold voltage can be greatly lowered through an additional increase of the amount of the work function adjustment material that is diffused into the gate dielectric layer 313 if necessary, and thus the difference between the multiple threshold voltages can be surely increased. At the second region II, the thickness between the threshold voltage adjustment layer 320 and the gate dielectric layer 313 is largest, but in consideration of the amount of the work function adjustment material that is diffused from the threshold voltage adjustment layer 319, the amount of the work function adjustment material that is diffused into the gate dielectric layer 313 can be greater than that on the third and fourth regions III and IV. Accordingly, the threshold voltage $Vt_{32}$ of the transistor TR32 formed on the second region II can be lower than voltages $Vt_{33}$ and $Vt_{34}$. Since the first region I includes the threshold voltage adjustment layer 319, and the thickness between the threshold voltage adjustment layer 320 and the gate dielectric layer 313 is thinner than that on the second region II, the threshold voltage $Vt_{31}$ of the transistor TR31 formed on the first region I may be lower than voltage $Vt_{32}$.

Figure 4:
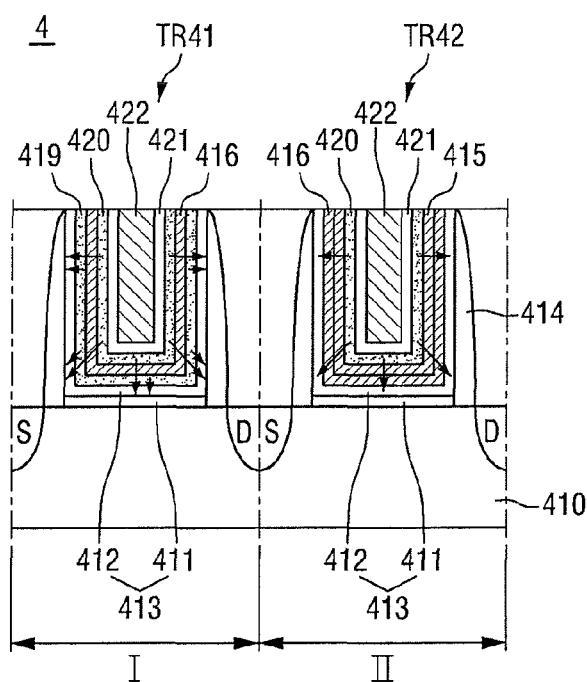
FIG. 4 is a cross-sectional view of a semiconductor device having multiple threshold voltages according to a fourth embodiment of the present inventive concept.

FIG. 4 is a cross-sectional view of a semiconductor device 4 having multiple threshold voltages according to another embodiment of the present inventive concept. A threshold voltage adjustment layer 419, an etch prevention layer 416, and a threshold voltage adjustment layer 420 may be formed at a first region I of a substrate 410. The etch prevention layer 416, a first functional layer 415, and the threshold voltage adjustment layer 420 may be formed in a second region. II. A protection layer 421 and a gate electrode 422 may be formed on the threshold voltage adjustment layer 420.

Here, if a heat treatment process to be described later is performed, the concentration of the work function adjustment material included in the second region II of the gate dielectric layer 413 may be lower than the concentration of the work function adjustment material included in the first region I of the gate dielectric layer 413. At the first and second regions I and II, the thicknesses between the threshold voltage adjustment layer 420 and the gate dielectric layer 413 are equal to each other, but the work function adjustment material is additionally diffused from the threshold voltage adjustment layer 419 to the gate dielectric layer 413. Accordingly, if it is assumed that the threshold voltages of the transistors TR41 and TR42 formed on the first and second region I and II are $Vt_{41}$ and $Vt_{42}$, respectively, then the following relationship would be established.

$$Vt_{42} > Vt_{41}$$

However, this is based on the assumption that the first and second transistors TR41 and TR42 are nFETs, but in the case of pFETs, they are the opposite.

FIGS. 5 to 9D are views explaining a method for fabricating a semiconductor device having multiple threshold voltages according to an embodiment of the present inventive concept. Here, a substrate 110 may have an nFET region and a pFET region. The nFET region and the pFET region may include regions in which transistors having different threshold voltages are formed. For example, the nFET region may include a first region I, a second region II, and a third region III. Hereinafter, the detailed processes will be described mainly with respect to the nFET region. Alternatively, the processes may be performed with respect to the whole regions including an nFET region and a pFET region.

Figure 5:
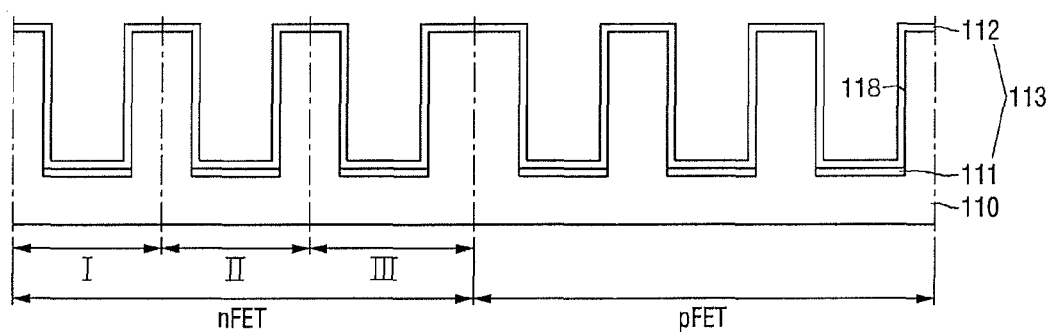
FIGS. 5 to 9D are views explaining a method for fabricating a semiconductor device having multiple threshold voltages according to an embodiment of the present inventive concept.

Referring to FIG. 5, a gate dielectric layer 113 is formed on the substrate 110. The gate dielectric layer 113 may include an interface film 110 and a gate insulating film 112. Here, the interface film 110 may be formed along a bottom surface of a trench 118, and the gate insulating film 112 may be conformally formed along a side wall and the bottom surface of the trench 118.

Figure 6:
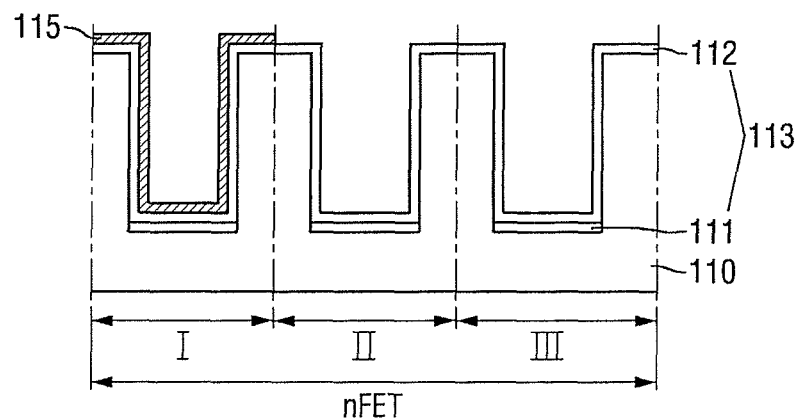

Referring to FIG. 6, a first functional layer 115 is formed on the first region I on the substrate 110. The first functional layer 115 is formed on the first through third regions I, II, and III on the substrate 110, and the first functional layer 115 of the second and third regions II and III is etched. Accordingly, a chemical etching process may be applied.

Figure 7:
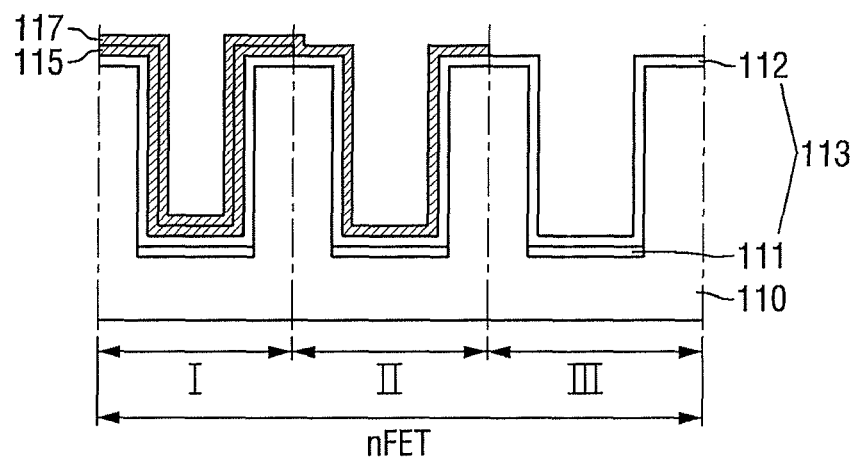

Referring to FIG. 7, a second functional layer 117 is formed on the first and second regions I and II on the substrate 110. In a similar manner to the process of forming the first functional layer 115, the second functional layer 117 may be formed on the first through third regions I, II, and III on the substrate 110. The second functional layer 117 of the third region III is etched.

Figure 8:
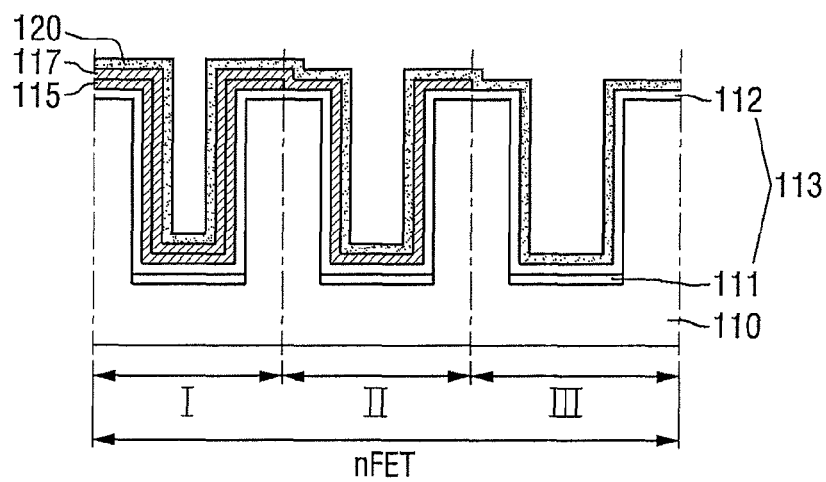

Referring to FIG. 8, a threshold voltage adjustment layer 120 is formed on the nFET region, e.g., first through third regions I, II, and III, and the pFET region of the substrate 110. Next, a protection layer 121 may be formed on the threshold voltage adjustment layer 120.

Then, by performing a heat treatment process, a work function adjustment material included in the threshold voltage adjustment layer 120 may be diffused into the gate dielectric layer 113. Specifically, if the heat treatment is performed, the work function adjustment material included in the threshold voltage adjustment layer 120 is diffused into the gate dielectric layer 113 through at least one of the first functional layer 115 and the second functional layer 117. In this case, due to the thickness difference that is caused by the layer, i.e., at least one of the first functional layer 115 and the second functional layer 117, formed between the threshold voltage adjustment layer 120 and the gate dielectric layer 113, the amount of the work function adjustment material that is diffused into the gate dielectric layer 113 may differ. The heat treatment process may be performed preferably at a temperature between about 900° C. and about 1050° C.

Figure 9A:
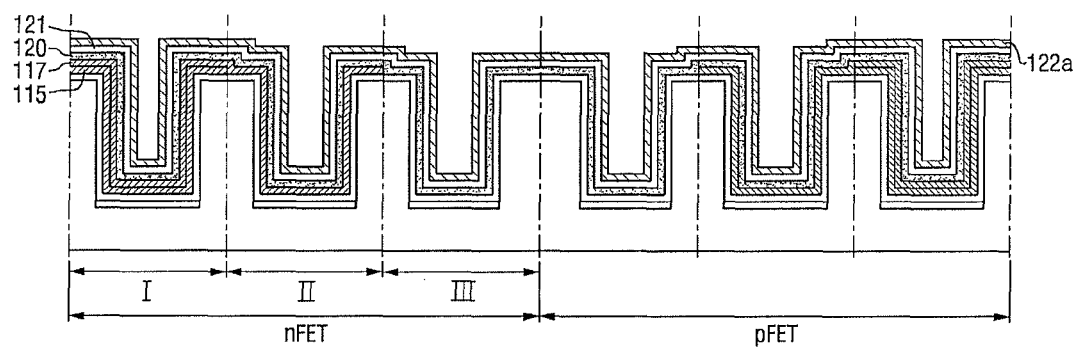
Figure 9B:
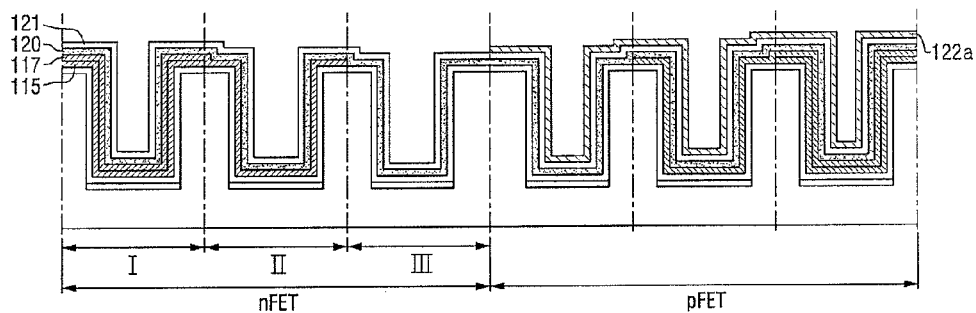
Figure 9C:
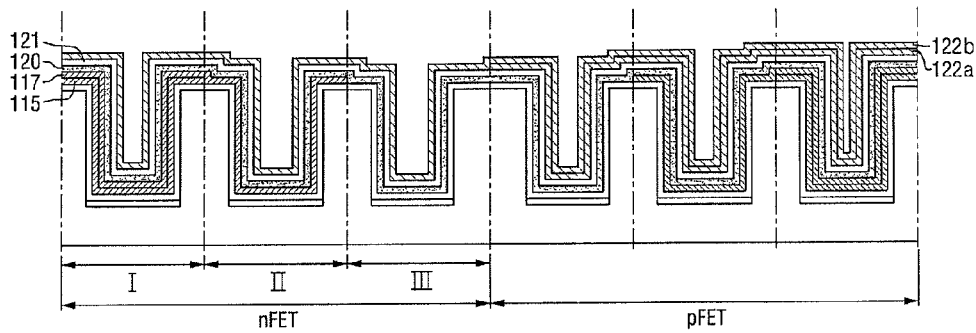
Figure 9D:
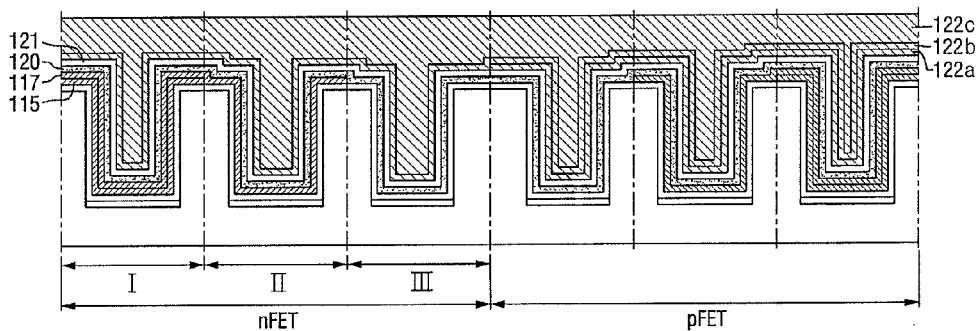

After a formed gate stack is etched, a process of stacking a work function metal gate on the nFET region and the pFET region may be performed. Referring to FIGS. 9A to 9C, a p-type work function metal layer 122a may be formed on the nFET region and the pFET region of the substrate 110. The p-type work function metal layer 122a may be removed from the nFET region of the substrate 110. An n-type work function metal layer 122b may be formed on the nFET region of the substrate 110. Next, referring to FIG. 9D, a gate metal 122c may be formed on the nFET region and the pFET region of the substrate 110.

The n-type metal gate may include Al, Ta, Mo, Zr, Hf, V, Ti, a nitride thereof, an alloy thereof, or a stacked structure thereof. The p-type metal gate may include Co, Pd, Ni, Re, Ir, Ru, Ti, a nitride thereof, an alloy thereof, or a stacked structure thereof. Thereafter, a process of forming source and drain regions on both sides of the gate stack may be performed.

FIGS. 10 to 13 are views explaining a method for fabricating a semiconductor device having multiple threshold voltages according to another embodiment of the present inventive concept. Here, a substrate 210 may have an nFET region and a pFET region. The nFET region and the pFET region may include regions in which transistors having different threshold voltages are formed. For example, the nFET region may include a first region I, a second region II, a third region III, and a fourth region IV. Hereinafter, the detailed processes will be described mainly with respect to the nFET region. Alternatively, the processes may be performed with respect to the whole regions including the nFET region and the pFET region.

Figure 10:
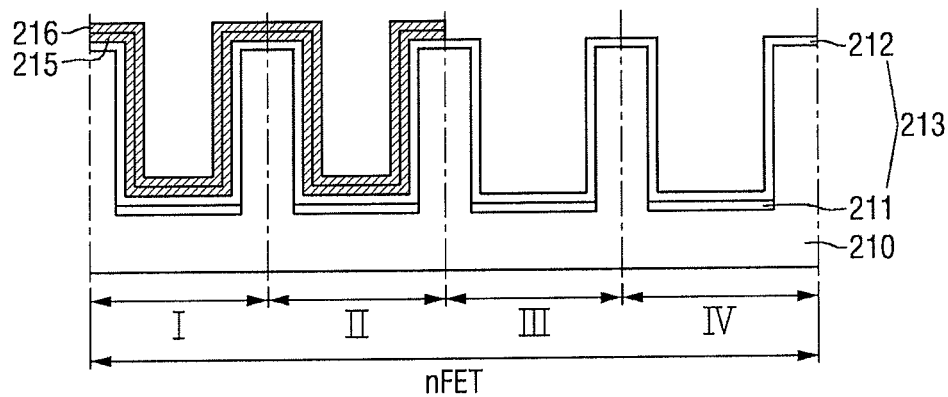
FIGS. 10 to 13 are views explaining a method for fabricating a semiconductor device having multiple threshold voltages according to another embodiment of the present inventive concept.

Referring to FIG. 10, as described above in relation to FIG. 5, a gate dielectric layer 213 may include an interface film 211 and a gate insulating film 212, and may be formed on the substrate 210. Next, a first functional layer 215 is formed on the first and second regions I and II on the substrate 210, and an etch prevention layer 216 is formed on the first functional layer 215 as formed above. Specifically, the first functional layer 215 and the etch prevention layer 216 are not formed on the third and fourth regions III and IV. The first functional layer 215 is formed on the first through fourth regions I, II, III, and IV on the substrate 210. The first functional layer 215 of the third and fourth regions III and IV is etched. For this, a chemical etching may be applied.

Figure 11:
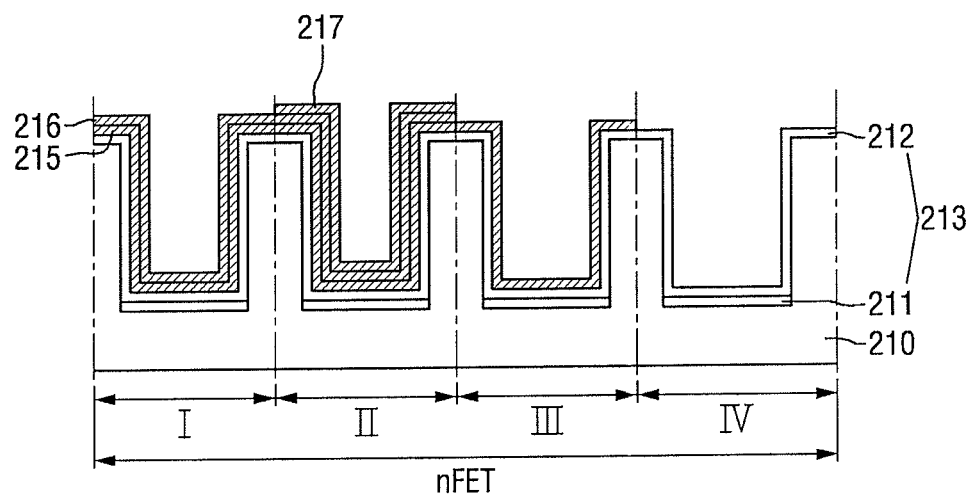

Referring to FIG. 11, a second functional layer 217 is formed on the second and third regions II and III on the substrate 210. In a similar manner to the process of forming the first functional layer 215 and the etch prevention layer 216, the second functional layer 217 may be formed on the first through fourth regions I, II, III, and IV on the substrate 210. The second functional layer 217 of the first, third, and fourth regions I, III, and IV may be etched.

Figure 12:
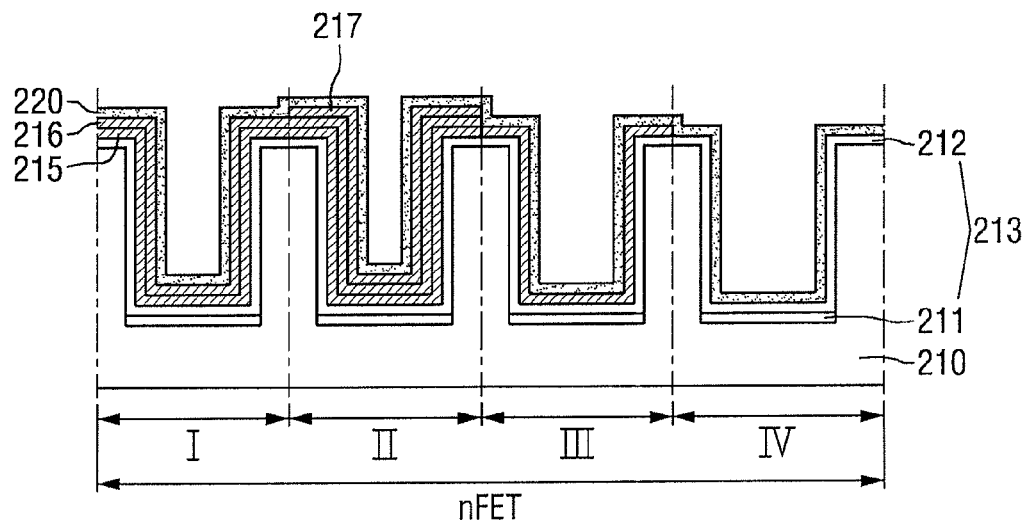
Figure 13:
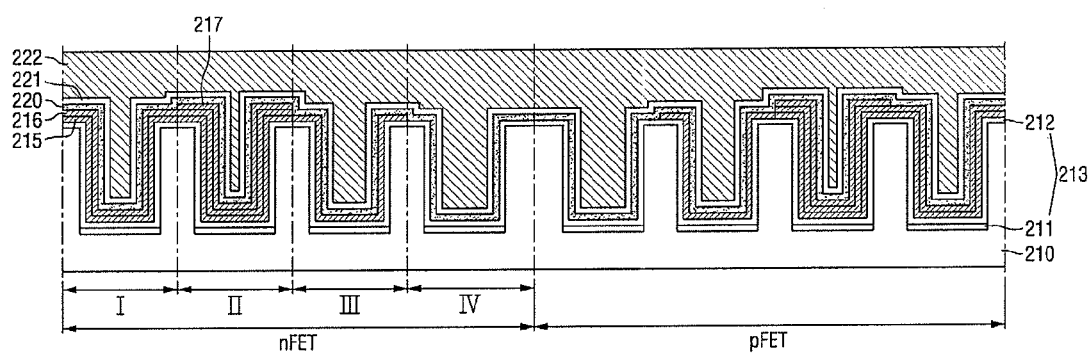

Referring to FIGS. 12 and 13, a threshold voltage adjustment layer 220 is formed on the first through fourth regions I, II, III, and IV of the substrate 210. Next, a protection layer 221 may be formed on the threshold voltage adjustment layer 220.

By performing a heat treatment process, a work function adjustment material included in the threshold voltage adjustment layer 220 may be diffused into the gate dielectric layer 213. Specifically, if the heat treatment is performed, the work function adjustment material included in the threshold voltage adjustment layer 220 is diffused into the gate dielectric layer 213 through at least one of the first functional layer 215, the etch prevention layer 216, and the second functional layer 217. In this case, due to the thickness difference that is caused by the layer, i.e., at least one of the first functional layer 215, the etch prevention layer 216, and the second functional layer 217, formed between the threshold voltage adjustment layer 220 and the gate dielectric layer 213, the amount of the work function adjustment material that is diffused into the gate dielectric layer 213 may differ.

After the formed gate stack is etched, a process that includes stacking a work function metal gate on the nFET region and the pFET region may be performed.

Figure 14A:
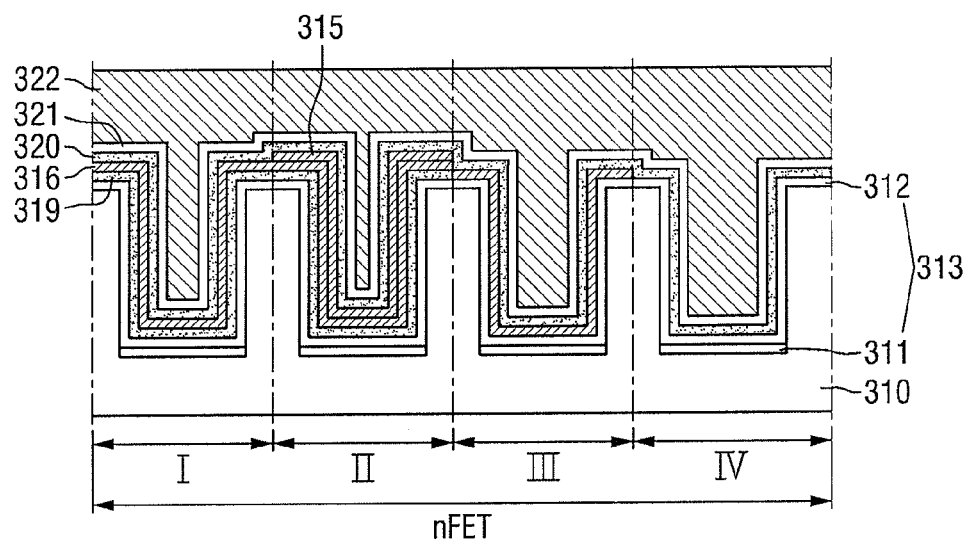
FIGS. 14A and 14B are views illustrating a method for fabricating a semiconductor device having multiple threshold voltages according to another embodiment of the present inventive concept.
Figure 14B:
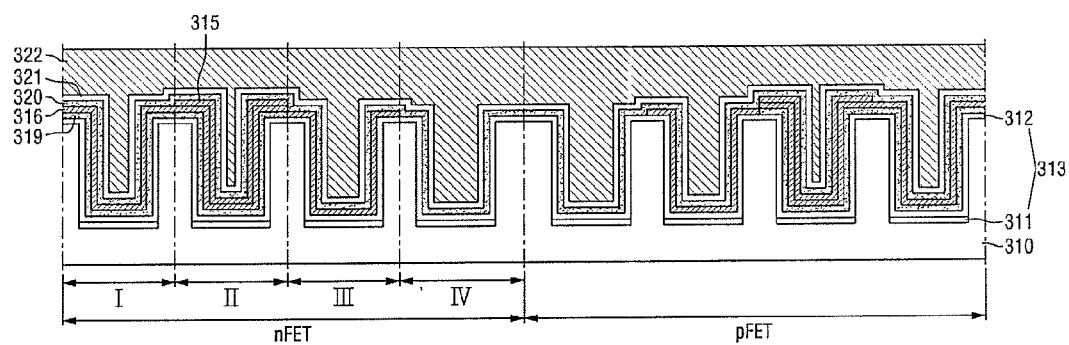

FIGS. 14A and 14B are views illustrating a method for fabricating a semiconductor device having multiple threshold voltages according to another embodiment of the present inventive concept. The embodiment illustrated in FIGS. 14A and 14B is different from the previously-described embodiment in that a threshold voltage adjustment layer 319 is formed instead of a first functional layer 215. After respective layers are formed as shown in FIGS. 14A and 14B, through performing of a heat treatment process, a work function adjustment material included in threshold voltage adjustment layers 319 and 320 may be diffused into a gate dielectric layer 313. If the heat treatment is performed, then the work function adjustment material is additionally diffused from the threshold voltage adjustment layer 319, and the threshold voltage can be greatly lowered through an additional increase of the amount of the work function adjustment material that is diffused into the gate dielectric layer 313 if necessary. Accordingly, the difference between the multiple threshold voltages can be increased.

After a formed gate stack is etched, a process that includes stacking a work function metal gate on an nFET region and a pFET region may be performed.

According to the present inventive concept, a semiconductor device having multiple threshold voltages can be provided at a relatively low manufacturing cost and according to simple processes, without deteriorating the device performance due to the variation of the threshold voltage or deterioration of the charge mobility.

Figure 15:
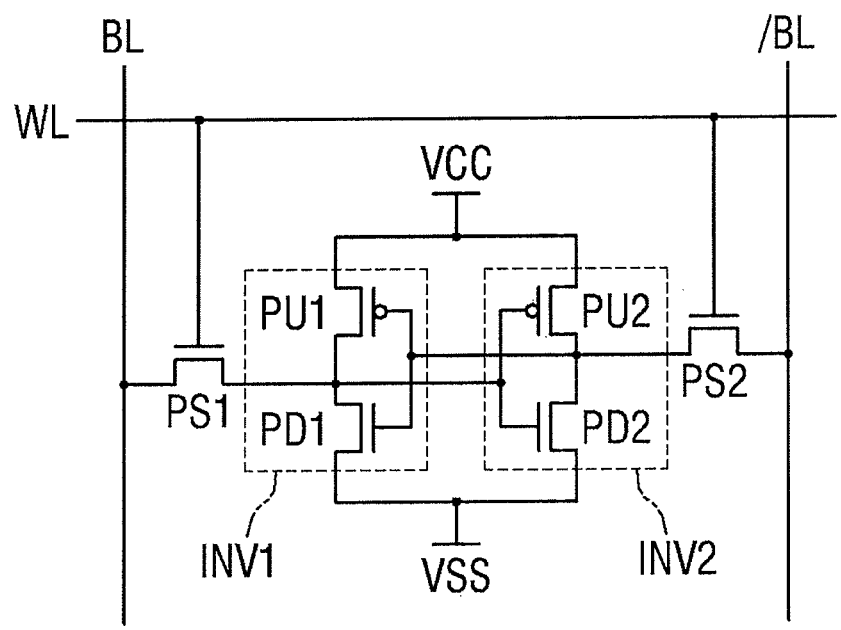
FIGS. 15 and 16 are a circuit diagram and a layout diagram of a semiconductor device according to another embodiment of the present inventive concept.
Figure 16:
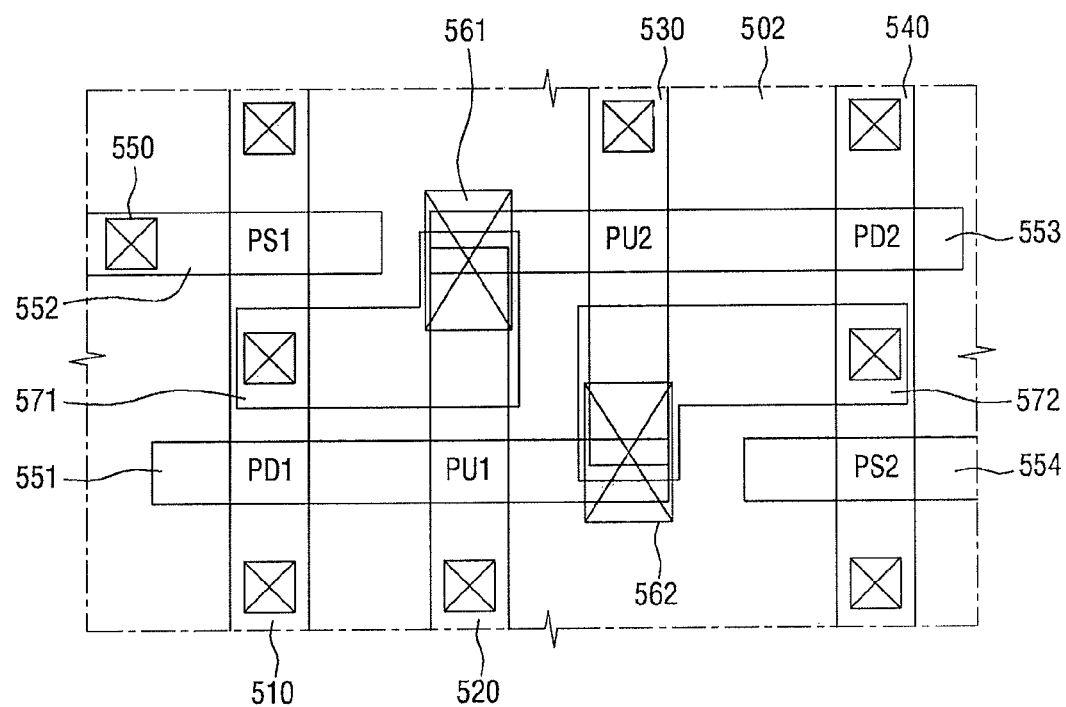

FIGS. 15 and 16 are a circuit diagram and a layout diagram of a semiconductor device according to another embodiment of the present inventive concept.

Referring to FIG. 15, a semiconductor device may include a pair of inverters INV1 and INV2 connected in parallel between a power supply node Vcc and a ground node Vss, a first path transistor PS1, and a second pass transistor PS2 connected to output nodes of the inverters INV1 and INV2, respectively. The first pass transistor PS1 and the second pass transistor PS2 may be connected to a bit line BL and a complementary bit line/BL, respectively. Gates of the first pass transistor PS1 and the second pass transistor PS2 may be connected to a word line WL.

The first inverter INV1 includes a first pull-up transistor PU1 and a first pull-down transistor PD1 connected in series. The second inverter INV2 includes a second pull-up transistor PU2 and a second pull-down transistor PD2 connected in series. The first pull-up transistor PU1 and the second pull-up transistor PU2 may be PFFT transistors. The first pull-down transistor PD1 and the second pull-down transistor PD2 may be NFET transistors.

The first inverter INV1 and the second inverter INV2 may constitute a latch circuit, wherein an input node of the first inverter INV1 is connected to an output node of the second inverter INV2, and an input node of the second inverter INV2 is connected to an output node of the first inverter INV1.

Referring to FIG. 16, a first active region 510, a second active region 520, a third active region 530, and a fourth active region 540 are formed to extend in one direction, for example, an upper/lower direction as shown. The extending length of the second active region 520 and the third active region 530 may be shorter than the extending length of the first active region 510 and the fourth active region 540.

A first gate electrode 551, a second gate electrode 552, a third gate electrode 553, and a fourth gate electrode 554 may extend in another direction, for example, orthogonal to the direction of the first through fourth active regions 510 to 540, or a right/left direction as shown. Accordingly, at least one of the first through fourth gate electrodes 551 to 554 can be formed to cross at least one of the first through fourth active regions 510 to 540. Specifically, the first gate electrode 551 may be formed to completely cross the first active region 510 and the second active region 520 and to overlap a part of a vertical end of the third active region 530. The third gate electrode 553 may be formed to completely cross the fourth active region 540 and the third active region 530 and to overlap a part of a vertical end of the second active region 520. The second gate electrode 552 and the fourth gate electrode 554 may be formed to cross the first active region 510 and the fourth active region 540, respectively.

As illustrated, the first pull-up transistor PU1 is defined around a region where the first gate electrode 551 and the second active region 520 cross each other, the first pull-down transistor PD1 is defined around a region where the first gate electrode 551 and the first active region 510 cross each other, and the first pass transistor PS1 is defined around a region where the second gate electrode 552 and the first active region 510 cross each other. The second pull-up transistor PU2 is defined about a region where the third gate electrode 553 and the third active region 530 cross each other, the second pull-down transistor PD2 is defined around a region where the third gate electrode 553 and the fourth active region 540 cross each other, and the second pass transistor PS2 is defined around a region where the fourth gate electrode 554 and the fourth active region 540 cross each other.

Although not clearly illustrated, a source/drain may be formed on both sides of a region where the first through fourth gate electrodes 551 to 554 and the first through fourth active regions 510 to 540 cross each other. Further, a plurality of contacts 550 may be formed at or proximal the gate electrodes 551-554.

A first shared contact 561 can be coupled to each of the second active region 520, the third gate electrode 553, and a wiring 571. A second shared contact 562 can be coupled to each of the third active region 530, a first gate line 551, and a wiring 572.

For example, the first pull-up transistor PU1 and the second pull-up transistor PU2 may be configured as p-type transistors according to the embodiments of the present inventive concept. The first pull-down transistor PD1, the first pass transistor PS1, the second pull-down transistor PD2, and the second pass transistor PS2 may be configured as n-type transistors according to the embodiments of the present inventive concept.

Figure 17:
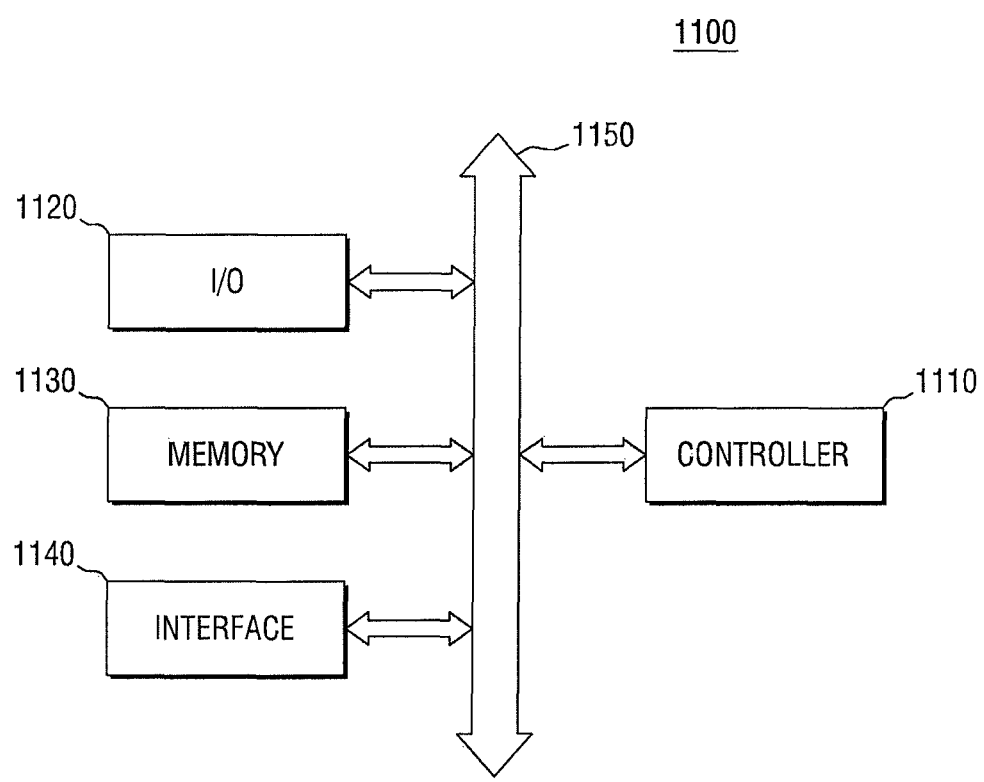
FIG. 17 is a block diagram of an electronic system including a semiconductor device according to some embodiments of the present inventive concept.

FIG. 17 is a block diagram of an electronic system including a semiconductor device according to some embodiments of the present inventive concept.

Referring to FIG. 17, an electronic system 1100 according to some embodiments of the present inventive concept may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 includes one or more data paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands.

The interface 1140 may transfer the data to a network such as a data communication network, or receive the data from the communication network. The interface 1140 may be of a wired or wireless type. For example, the interface 1140 may include an antenna or a wire/wireless transceiver. Although not illustrated, the electronic system 1100 may further include a high-speed DRAM and/or SRAM as an operating memory for improving the operation of the controller 1110.

A semiconductor device according to the embodiments of the present inventive concept may be provided inside the memory 1130 or may be provided as a part of the controller 1110 and the I/O device 1120.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

On the other hand, the semiconductor device to which the present inventive concept is applied may include a multi-gate FET MuGFET, for example, a fin FET finFET. Further, various embodiments of the present inventive concept may be applied to not only a planar FET but also a non-planar fin FET, but are not limited thereto.

Further, the semiconductor device to which the present inventive concept is applied may include a logic region and an SRAM region, and the transistor formed according to the above-described embodiments may be selectively formed as a logic nFET, a logic pFET, an SRAM nFET, or an SRAM pFET in the logic region or SRAM region. On the other hand, the application of the present inventive concept is not limited to the logic region and the SRAM region. The present inventive concept may also be applied to regions (e.g., DRAM, MRAM, RRAM, and PRAM) in which memories that are different from the memories in the logic region are formed.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A method for fabricating a semiconductor device comprising:
    forming a gate dielectric layer on a substrate including first through third regions;
    forming a first functional layer on only the first region of the first through third regions;
    forming a second functional layer on only the first and second regions of the first through third regions;
    forming a threshold voltage adjustment layer on the first through third regions, the threshold voltage adjustment layer including a work function adjustment material; and
    diffusing the work function adjustment material into the gate dielectric layer by performing a heat treatment process with respect to the substrate.

2. The method for fabricating a semiconductor device of claim 1, wherein an amount of the work function adjustment material, which is diffused into the gate dielectric layer of the first through third regions, differs at each of the first through third regions.

3. The method for fabricating a semiconductor device of claim 2, wherein the amount of the work function adjustment material that is diffused into the gate dielectric layer of the first region is smaller than the amount of the work function adjustment material that is diffused into the gate dielectric layer of the second region, and wherein the amount of the work function adjustment material that is diffused into the gate dielectric layer of the second region is smaller than the amount of the work function adjustment material that is diffused into the gate dielectric layer of the third region.

4. The method for fabricating a semiconductor device of claim 1, wherein the substrate further comprises a fourth region, wherein forming a second functional layer on only the first and second regions includes forming the first functional layer and an etch prevention layer on only the first and fourth regions, and wherein forming the threshold voltage adjustment layer that includes the work function adjustment material on the first through third regions includes forming the threshold voltage adjustment layer that includes the work function material on the first through fourth regions.

5. The method for fabricating a semiconductor device of claim 4, wherein the first functional layer comprises the work function adjustment material.

6. The method for fabricating a semiconductor device of claim 4, wherein at least one of the first functional layer, the second functional layer, or the etch prevention layer comprise at least one of Ti, Ta, and Si, a nitride thereof, an alloy thereof, or a stacked structure thereof.

7. The method for fabricating a semiconductor device of claim 6, wherein the first functional layer and the second functional layer each comprises TiN.

8. The method for fabricating a semiconductor device of claim 6, wherein the etch prevention layer comprises TaN.

9. The method for fabricating a semiconductor device of claim 1, wherein the work function adjustment material comprises at least one of lanthanide materials, a nitride thereof, or an alloy thereof.

10. The method for fabricating a semiconductor device of claim 9, wherein the work function adjustment material comprises La.

11. The method for fabricating a semiconductor device of claim 1, wherein forming the gate dielectric layer comprises:
    forming an interface film on the substrate; and
    forming a gate insulating film having high-k on the interface film.

12. The method for fabricating a semiconductor device of claim 1, wherein the substrate comprises an nFET region and a pFET region, and wherein the method further comprises forming an n-type metal gate on the nFET region and forming a p-type metal gate on the pFET region.

13. The method for fabricating a semiconductor device of claim 12, wherein forming the n-type metal gate on the nFET region and forming the p-type metal gate on the pFET region comprises:
    forming a p-type work function metal layer on the nFET region and the pFET region of the substrate;
    removing the p-type work function metal layer from the nFET region of the substrate; and
    forming the n-type work function metal layer on the nFET region of the substrate.

14. The method for fabricating a semiconductor device of claim 12, wherein the n-type metal gate includes at least one of Al, Ta, Mo, Zr, Hf, V, Ti, a nitride thereof, an alloy thereof, and a stacked structure thereof, and the p-type metal gate includes at least one of Co, Pd, Ni, Re, Ir, Ru, Ti, a nitride thereof, an alloy thereof, and a stacked structure thereof.

15. A method for fabricating a semiconductor device comprising:

forming a gate dielectric layer on a substrate including first and second regions;

forming a first threshold voltage adjustment layer on only the first region, the first threshold voltage adjustment layer including a work function adjustment material;

forming an etch prevention layer on the first and second regions;

forming a block layer on only the etch prevention layer of the second region;

forming a second threshold voltage adjustment layer that includes the work function adjustment material on the first and second regions so that the block layer is formed between the etch prevention layer and the second threshold adjustment layer in the second region; and diffusing the work function adjustment material into the gate dielectric layer by performing a heat treatment process with respect to the substrate.

16. The method for fabricating a semiconductor device of claim 15, wherein an amount of the work function adjustment material diffused into the gate dielectric layer of the first and second regions differs at each of the first and second regions.

17. The method for fabricating a semiconductor device of claim 16, wherein the amount of the work function adjustment material that is diffused into the gate dielectric layer of the second region is smaller than the amount of the work function adjustment material that is diffused into the gate dielectric layer of the first region.

18. The method for fabricating a semiconductor device of claim 16, wherein the block layer comprises at least one of Ti, Ta, and Si, a nitride thereof, an alloy thereof, or a stacked structure thereof.

19. A method for fabricating a semiconductor device comprising:

forming a gate dielectric layer on a substrate, the gate dielectric layer including a first region, a second region, and a third region, each of the first through third regions constructed and arranged for different threshold voltages;

forming a first functional layer on the first region;

forming a second functional layer on the first and second regions;

forming a threshold voltage adjustment layer on the first through third regions, the threshold voltage adjustment layer including a work function adjustment material; and diffusing the work function adjustment material into the gate dielectric layer, wherein a thickness of the semiconductor device from the threshold voltage adjustment layer to the gate dielectric layer is different at each of the first through third regions, wherein the amount of the work function adjustment material diffused into the gate dielectric layer is different at each of the first through third regions, and wherein the threshold voltages at the first through third regions, respectively, are dependent on the amounts of the work function adjustment material diffused into the gate dielectric layer at the first through respectively.

* * * * *